US007019679B2

(12) United States Patent
Mulder et al.

(10) Patent No.: US 7,019,679 B2
(45) Date of Patent: Mar. 28, 2006

(54) MULTIPLEXER WITH LOW PARASITIC CAPACITANCE EFFECTS

(75) Inventors: Jan Mulder, Houten (NL); Franciscus Maria Leonardus van der Goes, The Hague (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/953,420

(22) Filed: Sep. 30, 2004

(65) Prior Publication Data

US 2005/0035810 A1 Feb. 17, 2005

Related U.S. Application Data

(63) Continuation-in-part of application No. 10/893,999, filed on Jul. 20, 2004, now Pat. No. 6,888,483, which is a continuation of application No. 10/688,921, filed on Oct. 21, 2003, now Pat. No. 6,788,238, which is a continuation of application No. 10/349,073, filed on Jan. 23, 2003, now Pat. No. 6,674,388, which is a continuation of application No. 10/158,595, filed on May 31, 2002, now Pat. No. 6,573,853.

(51) Int. Cl.
*H03M 1/34* (2006.01)

(52) U.S. Cl. ........................................ 341/158

(58) Field of Classification Search ............... 341/143, 341/118, 144, 155, 139, 154; 327/108, 103; 326/115, 110

See application file for complete search history.

(56) References Cited

U.S. PATENT DOCUMENTS

| | | | |
|---|---|---|---|
| 4,190,805 A | 2/1980 | Bingham | |
| 4,978,957 A | 12/1990 | Hotta et al. | |
| 4,989,003 A | 1/1991 | Sauer | |
| 5,130,572 A | 7/1992 | Stitt et al. | |
| 5,191,336 A | 3/1993 | Stephenson | |
| 5,973,632 A | 10/1999 | Tai | |
| 6,037,891 A | 3/2000 | Griph | |
| 6,252,454 B1 | 6/2001 | Thompson et al. | |
| 6,259,745 B1 | 7/2001 | Chan | |
| 6,362,697 B1 * | 3/2002 | Pulvirenti | 331/111 |

(Continued)

OTHER PUBLICATIONS

Abo, A.M. and Gray, P.R., "A 1.5-V, 10-bit, 14.3-MS/s CMOS Pipeline Analog-to-Digital Converter," *IEEE Journal of Solid-State Circuits*, IEEE, vol. 34, No. 5, May 1999, pp. 599-606.

(Continued)

*Primary Examiner*—Brian Young
(74) *Attorney, Agent, or Firm*—Sterne, Kessler, Goldstein & Fox P.L.L.C.

(57) ABSTRACT

A differential multiplexer includes a plurality of multiplexing circuits. Each multiplexing circuit inputs a corresponding differential input signal including a positive input signal and a negative input signal, and outputs positive and negative output signals. Each multiplexing circuit includes first, second, third and fourth transistors. The first and second transistors input the positive input signal. The third and fourth transistors input the negative input signal. Outputs of the first and third transistors are connected to the positive output signal. Outputs of the second and fourth transistors are connected to the negative output signal. The positive and negative output signals are controlled using gate voltages on the first and fourth transistors. The second and third transistors are turned off when the differential multiplexer is in use. The transistors are cross-coupled to make leakage between the positive and negative input signals common mode in the positive and negative output signals.

7 Claims, 12 Drawing Sheets

U.S. PATENT DOCUMENTS

| | | | | |
|---|---|---|---|---|
| 6,373,343 | B1 * | 4/2002 | Baldwin et al. | 331/76 |
| 6,489,913 | B1 | 12/2002 | Hansen et al. | |
| 6,531,973 | B1 * | 3/2003 | Brooks et al. | 341/143 |
| 6,573,853 | B1 | 6/2003 | Mulder | |
| 6,614,375 | B1 * | 9/2003 | Hochschild | 341/143 |
| 6,674,388 | B1 | 1/2004 | Mulder | |
| 6,788,238 | B1 | 9/2004 | Mulder | |
| 2004/0257255 | A1 | 12/2004 | Mulder | |

OTHER PUBLICATIONS

Brandt, B.P. and Lutsky, J., "A 75-mW, 10-b, 20-MSPS CMOS Subranging ADC with 9.5 Effective Bits at Nyquist," *IEEE Journal of Solid-State Circuits*, IEEE, vol. 34, No. 12, Dec. 1999, pp. 1788-1795.

Bult, Klaas and Buchwald, Aaron, "An Embedded 240-mW 10-b 50-MS/s CMOS ADC in 1-mm$^2$," *IEEE Journal of Solid-State Circuits*, IEEE, vol. 32, No. 12, Dec. 1997, pp. 1887-1895.

Cho, T.B. and Gray, P.R., "A 10 b, 20 Msamples/s, 35 nW Pipeline A/D Converter," *IEEE Journal of Solid-State Circuits*, IEEE, vol. 30, No. 3, Mar. 1995, pp. 166-172.

Choe, M-J. et al., "A 13-b 40-Msamples/s CMOS Pipelined Folding ADC with Background Offset Trimming," *IEEE Journal of Solid-State Circuits*, IEEE, vol. 35, No. 12, Dec. 2000, pp. 1781-1790.

Choi, M. and Abidi, A., "A 6-b 1.3-Gsample/s A/D Converter in 0.35-µm CMOS," *IEEE Journal of Solid-State Circuits*, IEEE, vol. 36, No. 12, Dec. 2001, pp. 1847-1858.

Flynn, M. and Sheahan, B., "A 400-Msample/s, 6-b CMOS Folding and Interpolating ADC," *IEEE Journal of Solid-State Circuits*, IEEE, vol. 33, No. 12, Dec. 1998, pp. 1932-1938.

Geelen, G., "A 6b 1.1GSample/s CMOS A/D Converter," *IEEE International Solid-State Circuits Conference*, IEEE, 2001, pp. 128-129 and 438, no month given.

Hoogzaad, G. and Roovers, R., "A 65-mW, 10-bit, 40-Msample/s BiCMOS Nyquist ADC in 0.8 mm$^2$," *IEEE Journal of Solid-State Circuits*, IEEE, vol. 34, No. 12, Dec. 1999, pp. 1796-1802.

Hosotani, S. et al., "An 8-bit 20-MS/s CMOS A/D Converter with 50-mW Power Consumption," *IEEE Journal of Solid-State Circuits*, IEEE, vol. 25, No. 1 Feb. 1990, pp. 167-172.

Ingino, J.M. and Wooley, B.A., "A Continuously Calibrated 12-b, 10-MS/s, 3.3-V A/D Converter," *IEEE Journal of Solid-State Circuits*, IEEE, vol. 33, No. 12, Dec. 1998, pp. 1920-1931.

Ito, M. et al., "A 10 bit 20 MS/s 3 V Supply CMOS A/D Converter," *IEEE Journal of Solid-State Circuits*, IEEE, vol. 29, No. 12, Dec. 1994, pp. 1531-1536.

Kattman, K. and Barrow, J., "A Technique for Reducing Differential Non-Linearity Errors in Flash A/D Converters," *IEEE International Solid-State Conference*, IEEE, 1991, pp. 170-171, no month given.

Kusumoto, K. et al., "A 10-b 20-MHz 30-mW Pipelined Interpolating CMOS ADC," *IEEE Journal of Solid-State Circuits*, IEEE, vol. 28, No. 12, Dec. 1993, pp. 1200-1206.

Lewis, S. et al., "A 10-b 20-Msamples/s Analog-to-Digital Converter," *IEEE Journal of Solid-State Circuits*, IEEE, vol. 27, No. 3, Mar. 1992, pp. 351-358.

Mehr, I. and Singer, L., "A 55-mW, 10-bit, 40-Msample/s Nyquist-Rate CMOS ADC," *IEEE Journal of Solid-State Circuits*, IEEE, vol. 35, No. 3, Mar. 2000, pp. 318-325.

Nagaraj, K. et al., "Efficient 6-Bit A/D Converter Using a 1-Bit Folding Front End," *IEEE Journal of Solid-State Circuits*, IEEE, vol. 34, No. 8, Aug. 1999, pp. 1056-1062.

Nagaraj, K. et al., "A Dual-Mode 700-Msamples/s 6-bit 200-Msamples/s 7-bit A/D Converter in a 0.25-µm Digital CMOS," *IEEE Journal of Solid-State Circuits*, IEEE, vol. 35, No. 12, Dec. 2000, pp. 1760-1768.

Nauta, B. and Venes, A., "A 70-MS/s 110-mW 8-b CMOS Folding and Interpolating A/D Converter," *IEEE Journal of Solid-State Circuits*, IEEE, vol. 30, No. 12, Dec. 1995, pp. 1302-1308.

Pan, H. et al., "A 3.3-V 12-b 50-MS/s A/D Converter in 0.6-µm CMOS with over 80-dB SFDR," *IEEE Journal of Solid-State Circuits*, IEEE, vol. 35, No. 12, Dec. 2000, pp. 1769-1780.

Song, W-C. et al., "A 10-b 20-Msample/s Low-Power CMOS ADC," *IEEE Journal of Solid-State Circuits*, IEEE, vol. 30, No. 5, May 1995, pp. 514-521.

Sumanen, L. et al., "A 10-bit 2000-MS/s CMOS Parallel Pipeline A/D Converter," *IEEE Journal of Solid-State Circuits*, IEEE, vol. 36, No. 7, Jul. 2001, pp. 1048-1055.

Taft, R.C. and Tursi, M.R., "A 100-MS/s 8-b CMOS Subranging ADC with Sustained Parametric Performance from 3.8 V Down to 2.2 V," *IEEE Journal of Solid-State Circuits*, IEEE, vol. 36, No. 3, Mar. 2001, pp. 331-338.

van der Ploeg, H. and Remmers, R., "A 3.3-V, 10-b 25-Msample/s Two-Step ADC in 0.35-µm CMOS," *IEEE Journal of Solid-State Circuits*, IEEE, vol. 34, No. 12, Dec. 1999, pp. 1803-1811.

van der Ploeg, H. et al., "A 2.5-V 12-b 54-Msample/s 0.25-µm CMOS ADC in 1-mm$^2$ With Mixed-Signal Chopping and Calibration," *IEEE Journal of Solid-State Circuits*, IEEE, vol. 36, No. 12, Dec. 2001, pp. 1859-1867.

Vorenkamp, P. and Roovers, R., "A 12-b, 60-Msample/s Cascaded Folding and Interpolating ADC," *IEEE Journal of Solid-State Circuits*, IEEE, vol. 32, No. 12, Dec. 1997, pp. 1876-1886.

Wang, Y-T. and Razavi, B., "An 8-bit 150-MHz CMOS A/D Converter," *IEEE Journal of Solid-State Circuits*, IEEE, vol. 35, No. 3, Mar. 2000, pp. 308-317.

Yotsuyanagi, M. et al., "A 2 V, 10 b, 20 Msamples/s, Mixed-Mode Subranging CMOS A/D Converter," *IEEE Journal of Solid-State Circuits*, IEEE, vol. 30, No. 12, Dec. 1995, pp. 1533-1537.

Yu, P.C. and Lee, H-S., "A 2.5-V, 12-b, 5-Msample/s Pipelined CMOS ADC," *IEEE Journal of Solid-State Circuits*, IEEE, vol. 31, No. 12, Dec. 1996, pp. 1854-1861.

Miyazaki et al., ISSCC 2002/Session 10/High-Speed ADCs/ 10.5, "A 16mW 30 MSample/s 10b Pipelined A/D Converter using a Pseudo-Differential Architecture", Feb. 5, 2002, 3 pgs.

Sushihara et al., ISSCC 2002/Session 10/High-Speed ADCs/ 10.3, "A 7b 450 MSample/s 50mW CMOS ADC in 0.3 mm2", Feb. 5, 2002, 3 pgs.

Dingwall et al., IEEE Journal of Solid-State Circuits, vol. SC-20 No. 6, "An 8-MHz CMOS Subranging 8-Bit A/D Converter", Dec. 1985, pp. 1138-1143.

* cited by examiner

MULTIPLEXER WITH LOW PARASITIC CAPACITANCE EFFECTS

CROSS-REFERENCE TO RELATED APPLICATIONS

This application is a Continuation-in-part of application Ser. No. 10/893,999, Filed: Jul. 20, 2004 now U.S. Pat. No. 6,888,483, Titled: HIGH SPEED ANALOG TO DIGITAL CONVERTER, which is a Continuation of application Ser. No. 10/688,921, Filed: Oct. 21, 2003 now U.S. Pat. No. 6,788,238, Titled: HIGH SPEED ANALOG TO DIGITAL CONVERTER, which is a Continuation of application Ser. No. 10/349,073, Filed: Jan. 23, 2003 now U.S. Pat. No. 6,674,388, Titled: HIGH SPEED ANALOG TO DIGITAL CONVERTER, which is a Continuation of application Ser. No. 10/158,595, Filed: May 31, 2002 now U.S. Pat. No. 6,573,853, Titled: HIGH SPEED ANALOG TO DIGITAL CONVERTER, all of which are incorporated by reference herein.

BACKGROUND OF THE INVENTION

1. Field of the Invention

The present invention relates to multiplexers, and, more particularly, to multiplexers with low cross-talk between signals.

2. Related Art

A subranging analog to digital converter (ADC) architecture is suitable for implementing high-performance ADC's (i.e. high speed, low power, low area, high resolution). FIG. 1 shows a generic two-step subranging architecture, comprising a reference ladder 104, a coarse ADC 102, a switching matrix 103, a fine ADC 105, coarse comparators 107, fine comparators 108 and an encoder 106. In most cases, a track-and-hold 101 is used in front of the ADC. In this architecture, an input voltage is first quantized by the coarse ADC 102. The coarse ADC 102 compares the input voltage against all the reference voltages, or against a subset of the reference voltages that is uniformly distributed across the whole range of reference voltages. Based on a coarse quantization, the switching matrix 103 connects the fine ADC 105 to a subset of the reference voltages (called a "subrange") that is centered around the input signal voltage.

Modem flash, folding and subranging analog to digital converters (ADC's) often use averaging techniques for reducing offset and noise of amplifiers used in the ADC. One aspect of averaging is the topology that is used to accomplish averaging, i.e., which amplifier outputs in which arrays of amplifiers are averaged together.

In general, flash, folding and subranging ADC's use cascades of distributed amplifiers to amplify the residue signals before they are applied to the comparators. These residue signals are obtained by subtracting different DC reference voltages from an input signal $V_{in}$. The DC reference voltages are generated by the resistive ladder (reference ladder) 104 biased at a certain DC current.

High-resolution ADC's often use auto-zero techniques, also called offset compensation techniques, to suppress amplifier offset voltages. In general, autozeroing requires two clock phases ($\phi_1$ and $\phi_2$). During the auto-zero phase, the amplifier offset is stored on one or more capacitors, and during the amplify phase, the amplifier is used for the actual signal amplification.

Two different auto-zero techniques can be distinguished, which are illustrated in FIGS. 2 and 3. The technique shown in FIG. 2 connects an amplifier 201 in a unity feedback mode during the auto-zero clock phase $\phi_1$. As a result, a large part of the amplifier 201 input offset voltage is stored on input capacitors C1*a*, C1*b*. The remaining offset is stored on output capacitors C2*a*, C2*b* if available.

The second technique, shown in FIG. 3, shorts the amplifier 201 inputs during the auto-zero phase $\phi_1$ and connects them to a DC bias voltage $V_{res}$. Here, the amplifier 201 output offset voltage is stored on the output capacitors C2*a*, C2*b*. Many ADC architectures use a cascade of several (auto-zero) amplifiers to amplify the input signal prior to applying to the comparators 107, 108. In general, flash, folding and subranging ADC's use arrays of cascaded amplifiers, and averaging and interpolation techniques are used to improve performance.

Unfortunately, the performance of cascaded arrays of amplifiers degrades significantly at high clock and input signal frequencies. The cause of this degradation is illustrated in FIG. 4 when the reset technique shown in FIG. 3 is used, and where $R_{SW}$ is shown as a circuit element, and the current flow $I_C$ is explicitly shown.

When the amplifier 201 is in the auto-zero phase $\phi_1$, the input capacitors C1*a*, C1*b* are charged to the voltage $V_{sample}$ that is provided by the track-and-hold amplifier 101. As a result, a current $I_C$ will flow through the input capacitors C1*a*, C1*b* and an input switch (not shown). Due to the finite on-resistance $R_{SW}$ of the input switch (see FIG. 4), an input voltage is generated, which will settle exponentially towards zero. This input voltage is amplified by the amplifier 201 and results in an output voltage that also slowly settles towards zero (assuming the amplifier 201 has zero offset).

Essentially, the auto-zero amplifier 201 is in a "reset" mode one-half the time, and in an "amplify" mode the other one-half the time. When in reset mode, the capacitors C1*a*, C1*b* are charged to the track-and-hold 101 voltage, and the current $I_C$ flows through the capacitors C1*a*, C1*b* and the reset switches, so as to charge the capacitors C1*a*, C1*b*.

When the ADC has to run at high sampling rates, there is not enough time for the amplifier 201 output voltage to settle completely to zero during the reset phase. As a result, an error voltage is sampled at the output capacitors C2*a*, C2*b* that is dependent on the voltage $V_{sample}$. This translates into non-linearity of the ADC, and often causes inter-symbol interference (ISI).

The problem of ISI occurs in most, if not all, ADC architectures and various approaches exist for attacking the problem. The most straightforward approach is to decrease the settling time constants. However, the resulting increase in power consumption is a major disadvantage.

Another approach is to increase the time allowed for settling, by using interleaved ADC architectures. However, this increases required layout area. Furthermore, mismatches between the interleaved channels cause spurious tones. The ISI errors can also be decreased by resetting all cascaded amplifiers during the same clock phase. Unfortunately, this is not optimal for high speed operation either.

FIG. 9 illustrates a simple conventional multiplexer. As shown in FIG. 9, two inputs, V1 and V2 are fed into two transistors, or switches, 902A, 902B, respectively. Depending on which of the switches 902A, 902B is on or off, the output voltage Vout is switched between V1 and V2. Note that each of the transistors 902A, 902B has parasitic capacitance Cp. For clarity, only one of the transistors is shown with the parasitic capacitance, but it will be appreciated that all such transistors have some parasitic capacitance. The parasitic capacitance Cp causes signal feedthrough (also known as "leakage," or "crosstalk") of V2 to $V_{OUT}$ when the transistor 902B is supposed to be off. Similarly, when transistor 902A is off, its parasitic capacitance causes signal feedthrough to Vout. This effect is undesirable in multiplexers.

FIG. 10 illustrates a conventional approach to decreasing signal feedthrough. This approach relies on the addition of two switches (transistors) to ground, 906A and 906B, and additional switches 904A, 904B, connected as shown in FIG. 10. The switches 906A, 906B help reduce the signal feedthrough. However, this approach has two problems. It requires twice as many transistors for the same on-resistance Ron. Also, there is four times as much total gate capacitance in the overall circuit, which is important if the switches are clocked.

SUMMARY OF THE INVENTION

The present invention is directed to a multiplexer with low parasitic capacitance effects that substantially obviates one or more of the problems and disadvantages of the related art.

In one aspect of the invention there is provided a differential multiplexer including a plurality of multiplexing circuits. Each multiplexing circuit inputs a corresponding differential input signal including a positive input signal and a negative input signal, and outputs positive and negative output signals. Each multiplexing circuit includes first, second, third and fourth transistors. The first and second transistors input the positive input signal. The third and fourth transistors input the negative input signal. Outputs of the first and third transistors are connected to the positive output signal. Outputs of the second and fourth transistors are connected to the negative output signal. The positive and negative output signals are controlled using gate voltages on the first and fourth transistors. The second and third transistors are turned off when the differential multiplexer is in use.

In another aspect of the invention, there is provided a differential multiplexer including a plurality of multiplexing circuits. Each multiplexing circuit inputs a corresponding differential input signal including a positive input signal and a negative input signal, and outputs positive and negative output signals. Each multiplexing circuit includes a plurality of transistors cross-coupled to make leakage between the positive and negative input signals common mode in the positive and negative output signals.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGS.

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
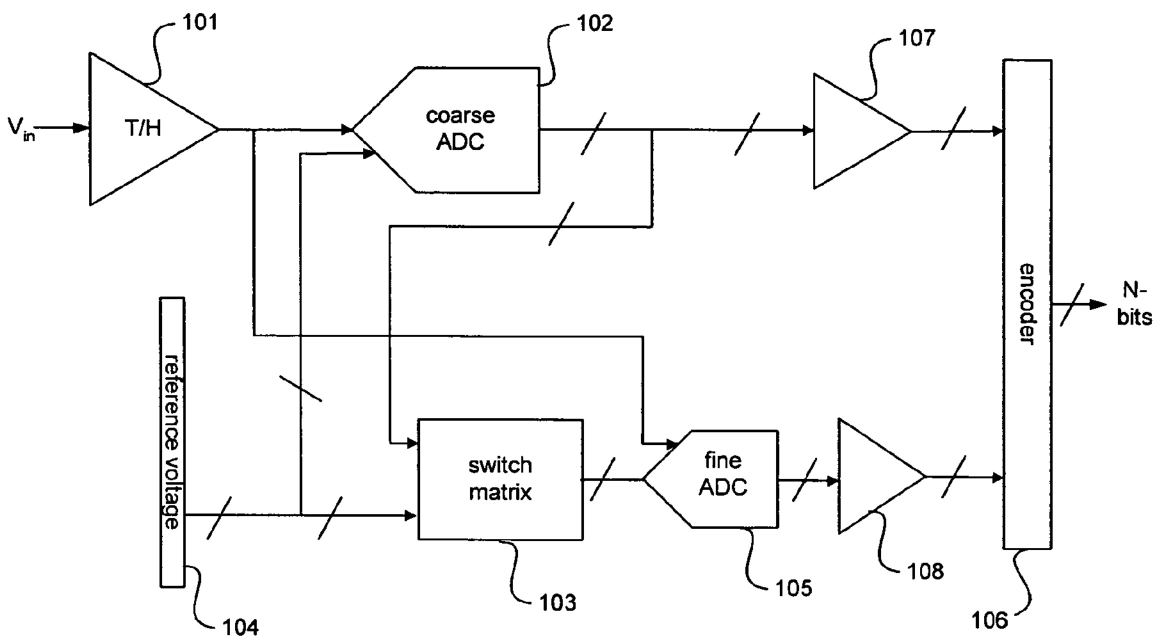
FIG. 1 illustrates a conventional averaging topology.
Figure 2:
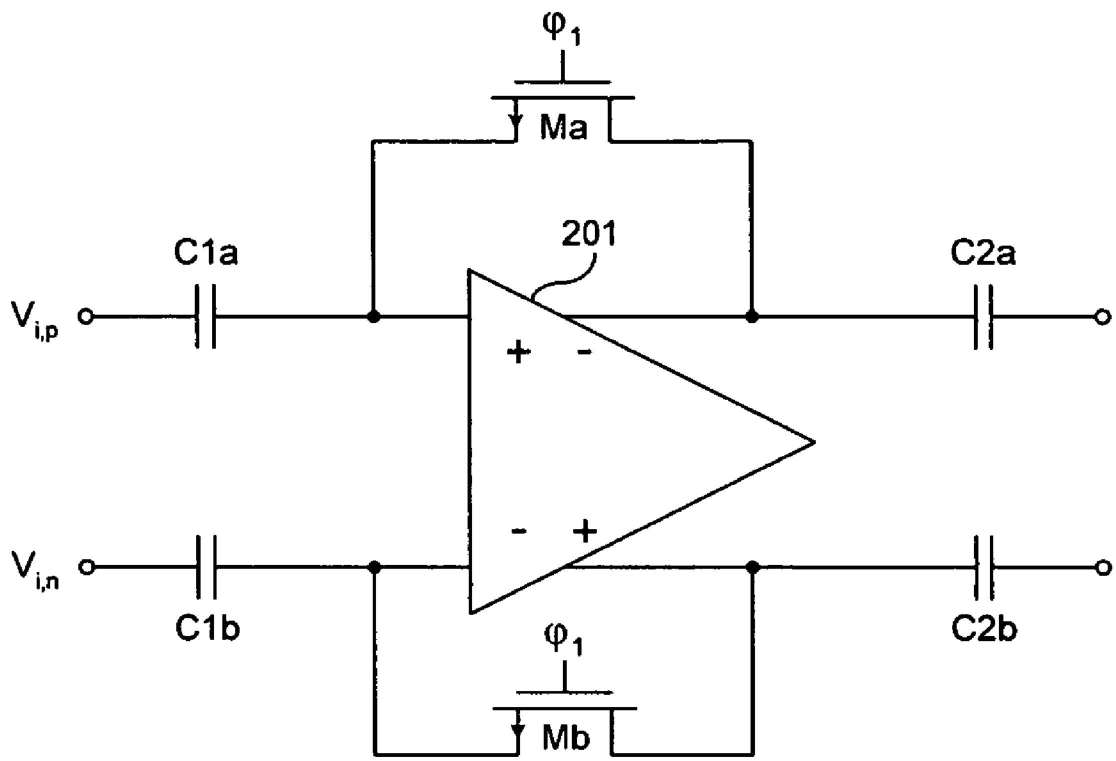
FIGS. 2 and 3 illustrate conventional amplifier topologies with reset switches.
Figure 10:
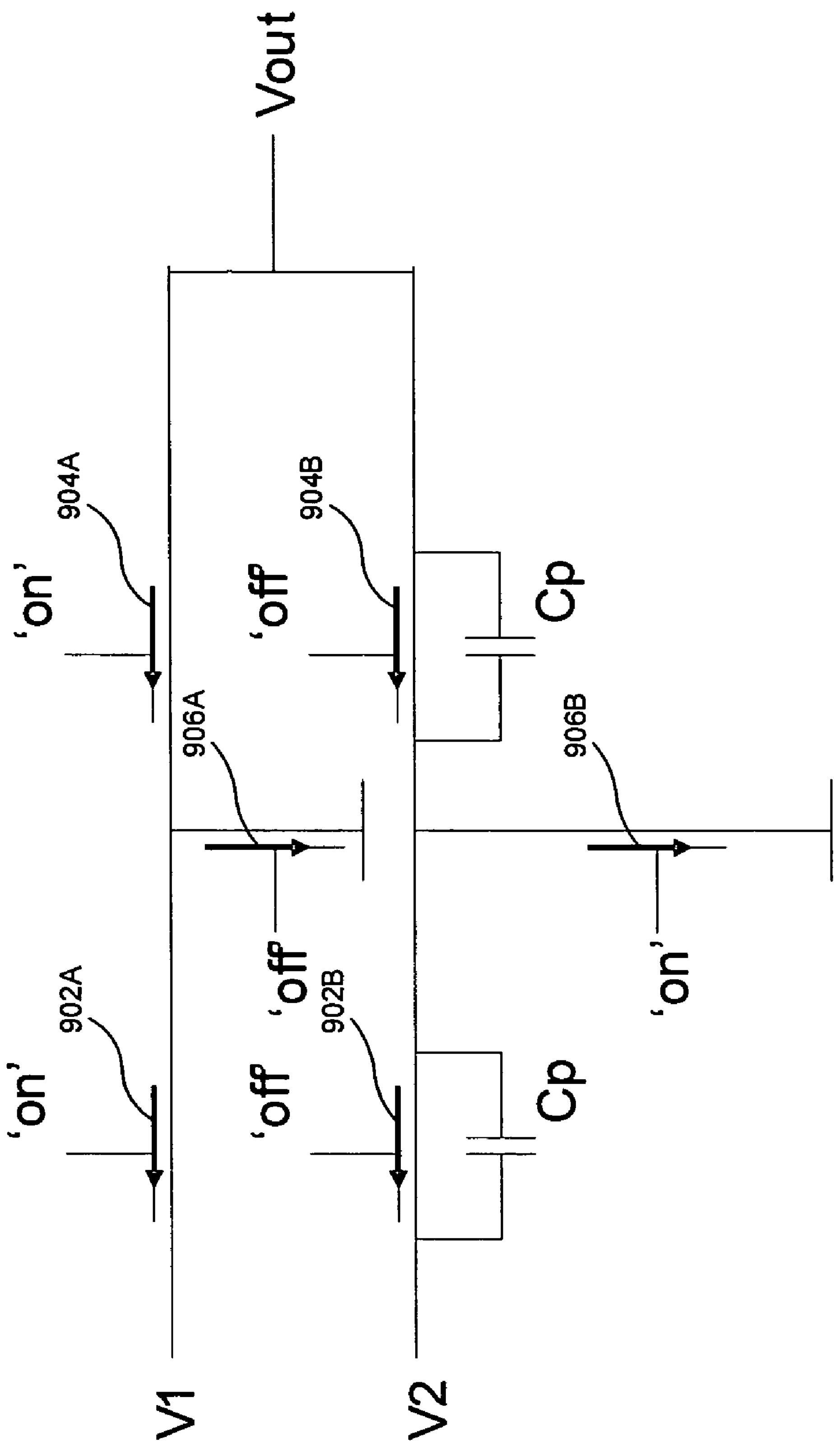
FIG. 10 illustrates a conventional approach to decreasing signal feedthrough.

Recently, a technique to address the nonlinearity was published by Miyazaki et al., "A 16 mW 30 M Sample/s pipelined A/D converter using a pseudo-differential architecture," ISSCC Digest of Tech. Papers, pp. 174–175 (2002), see particularly FIG. 10.5.2 therein. The technique applies only to amplifiers that use the auto-zero technique of FIG. 2.

In Miyazaki, four extra switches and two extra capacitors are required. The resulting circuit topology has a common-mode transfer function of "1" and a differential-mode transfer function of "0" during the reset clock phase.

However, an important disadvantage of the circuit shown in Miyazaki is that it requires twice the amount of capacitance. This has a serious impact on the ADC layout area. Furthermore, the capacitive loading of the track-and-hold 101 doubles, which significantly slows down the charging of the capacitors C1*a*, C1*b* (roughly by a factor of two).

Figure 5:
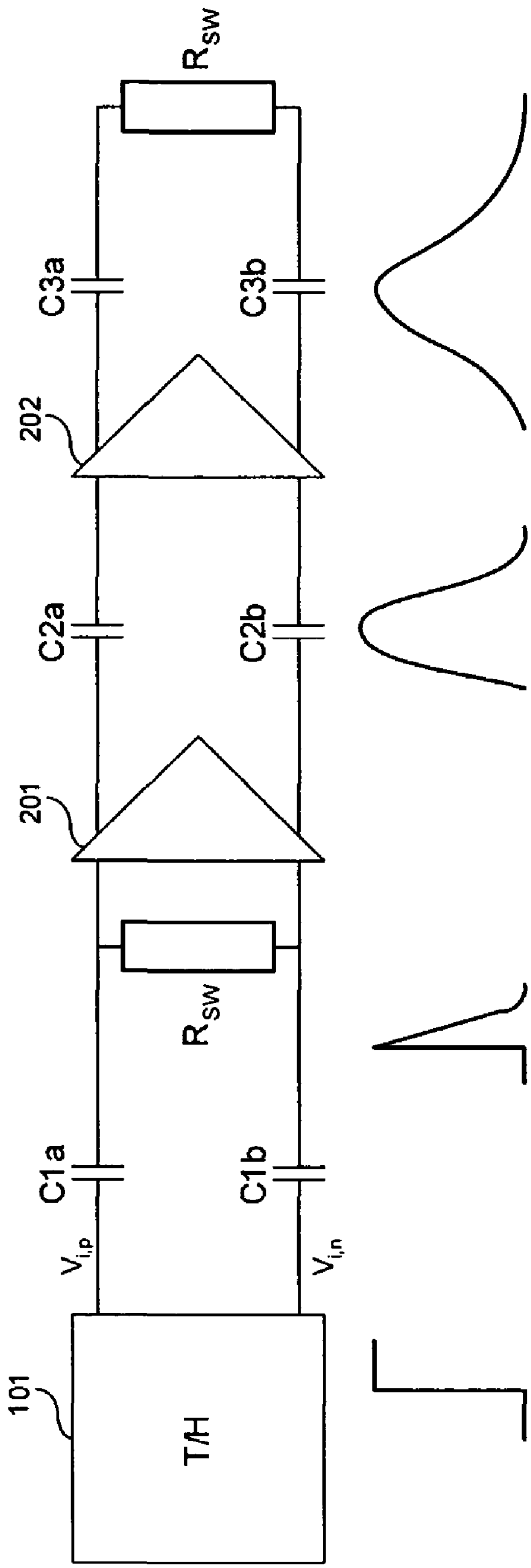
FIG. 5 illustrates a source of inter-symbol interference in greater detail.

FIG. 5 shows the rationale for the present invention. In FIG. 5, the track-and-hold amplifier 101 outputs a step function to the sampling capacitors C1*a*, C1*b*. Due to the finite resistance RSW, the pulse becomes a spike (i.e., it is effectively high-pass filtered) by the time it gets to the amplifier 201, which is the first amplifier in a cascade. The next set of capacitors C2*a*, C2*b* sees a "smeared-out" pulse, which, by the time it is amplified by the next amplifier in a cascade (amplifier 202), and charges the next stage capacitors C3*a* and C3*b*, becomes further "smeared-out". The spike being transferred throughout the cascaded amplifiers causes inter-symbol interference.

Figure 3:
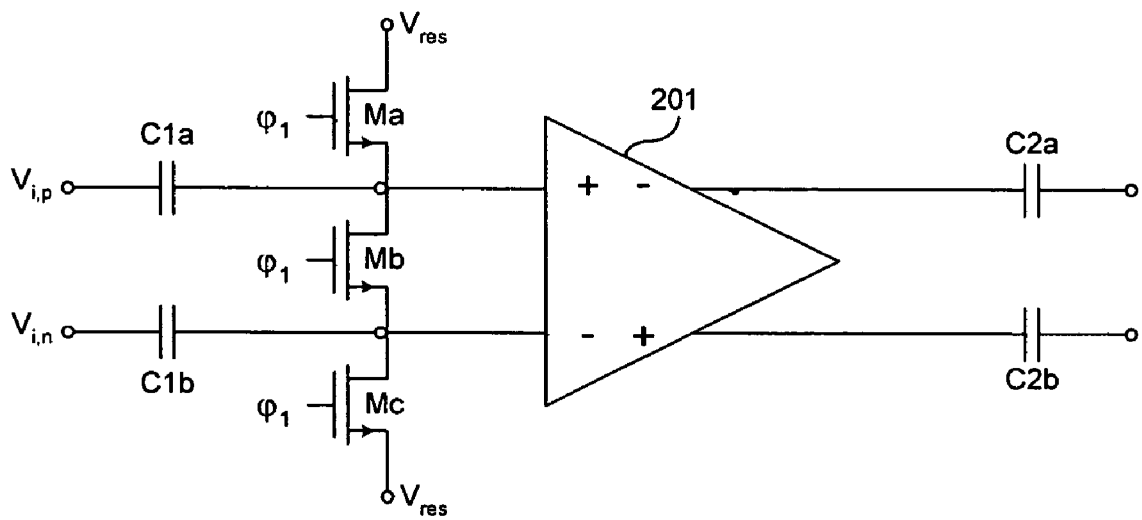
Figure 4:
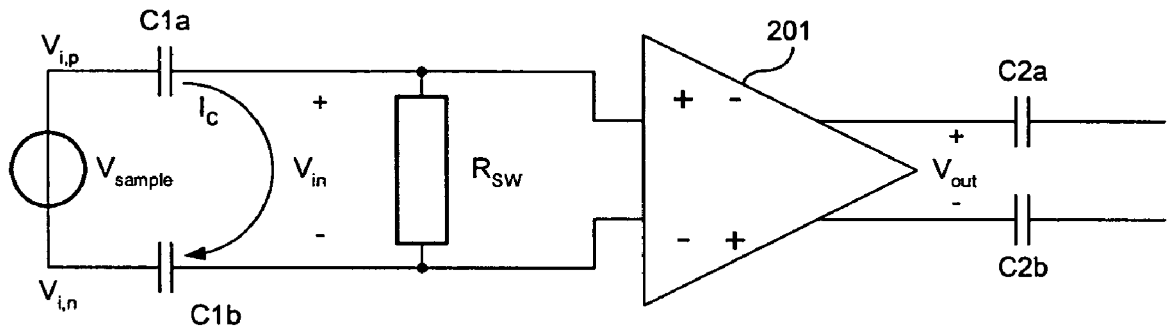
FIG. 4 illustrates a conventional amplifier topology and the source of the inter-symbol interference problem.
Figure 6:
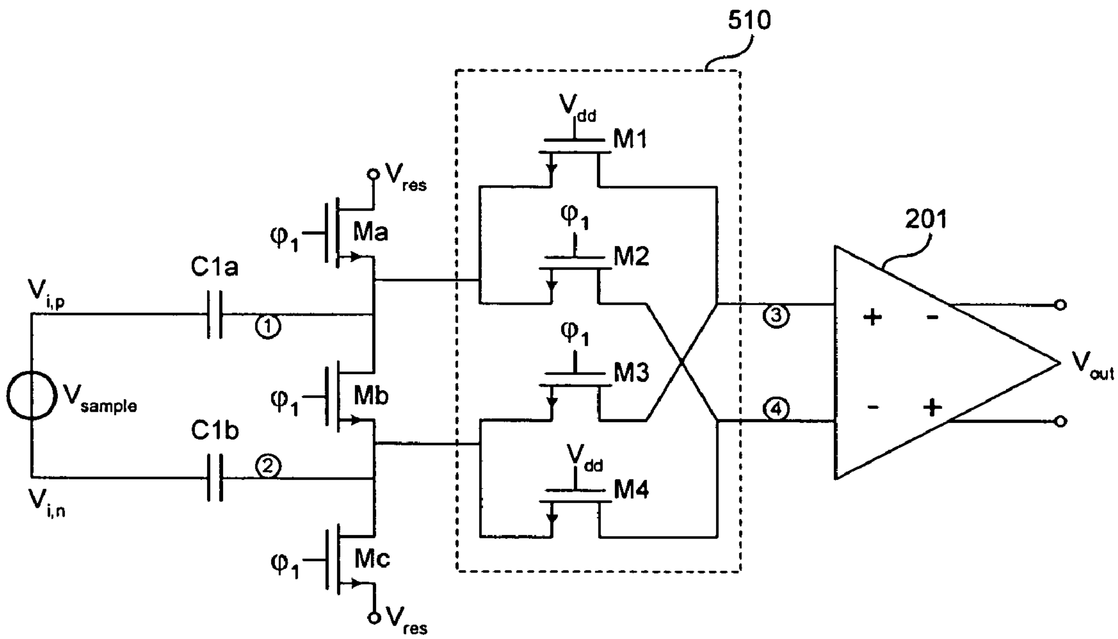
FIG. 6 illustrates one embodiment of the present invention.
Figure 7:
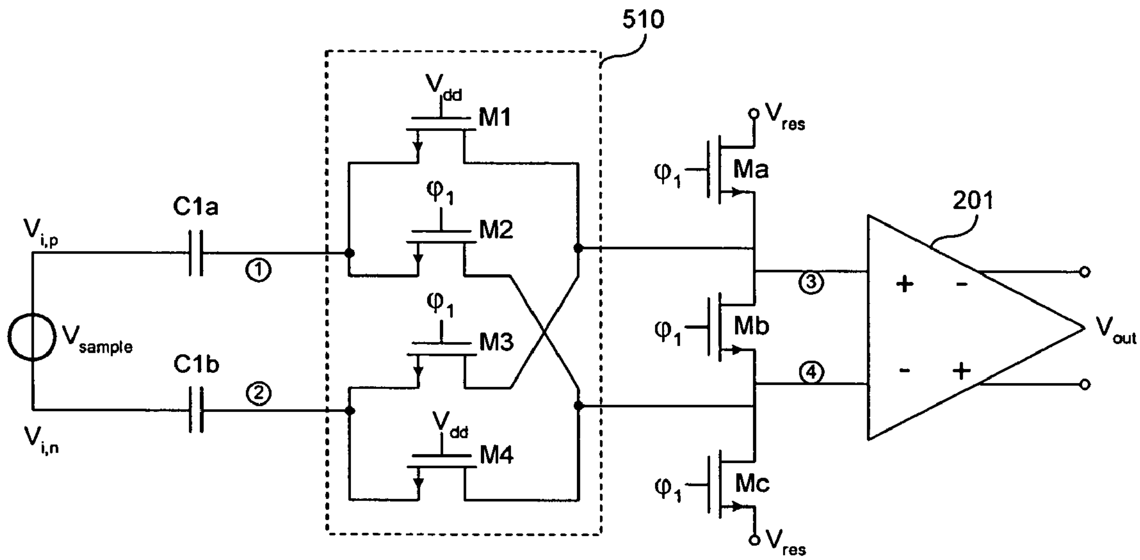
FIG. 7 illustrates another embodiment of the present invention.

The problem of ISI can be solved in a very elegant way by complementing the reset switches shown in FIG. 3 with some additional switches before the fine amplifiers of the fine ADC 105. The resulting circuit is shown in FIG. 6. The extra switches are contained in the dashed box 510 (a transfer matrix or transfer circuit). FIG. 7 shows a modification of the new circuit that works in a similar way.

The transfer circuit shown in the dashed box 510 has a transfer function of "1" for common-mode signals at all times, so that the common mode transfer function is $H_{CM}(\phi_1)=1$, $H_{CM}(\phi_2)=1$. However, the transfer function varies for differential signals depending on the clock phase ($\phi_1$ or $\phi_2$). More specifically, the transfer function for differential signals is $H_{DM}(\phi_1)=0$, and $H_{DM}(\phi_2)=1$. Hence, a differential voltage created across nodes 1 and 2 (due to the charging of the input capacitors C1*a*, C1*b*) is not transferred to input nodes 3 and 4 of the amplifier 201 during $\phi_1$. Therefore, the output voltage of the amplifier 201 is not affected by $V_{sample}$ in any way, reducing the occurrence of ISI. The input capacitors C1*a*, C1*b* subtract track-and-hold amplifier 101 voltage from a reference ladder 104 voltage.

The technique presented herein can find application in various types of ADC architectures that use auto-zero techniques for combating amplifier offsets.

FIG. 6 shows one embodiment of the present invention. $\phi_1$ and $\phi_2$ represent two phases of a clock, preferably non-overlapping phases. As shown in FIG. 6, the sampling voltage $V_{sample}$ is differentially connected to two sampling capacitors C1*a*, and C1*b*, which are in turn connected to three switch transistors Ma, Mb and Mc. Gates of the switch transistors Ma, Mb, Mc are connected to $\phi_1$, a drain of the transistor Ma is connected to $V_{res}$, and a source of the transistor Mc is connected to the reset voltage $V_{res}$. Between the amplifier 201 and the switch transistors Ma, Mb, Mc, the transfer matrix 510 comprises four transistors M1, M2, M3 and M4. Gates of the transistors M2 and M3 are connected to $\phi_1$. Gates of the transistors M1 and M4 are connected to $V_{dd}$, the supply voltage. Sources of the transistors M1 and M2 are tied together and to the node 1, which is also connected to the sampling capacitor C1*a*. Sources of the transistors M3 and M4 are tied together and also connected to a node 2, which is also connected to the sampling capacitor C1*b*. Drains of the transistors M3 and M1 are tied together and to node 3, which is the "+" input of the amplifier 201. Drains of the transistors M2 and M4 are tied together and to node 4, which is also connected to the "–" input of the amplifier 201.

Thus, the circuit within the dashed box 510 may be referred to as a transfer matrix that has a property such that its differential mode transfer function $H(\phi_1)=0$, $H(\phi_2)=1$. This is different from a conventional approach, where the transfer function may be thought of as being H=1 for both $\phi_1$ and $\phi_2$.

It will be appreciated that while the overall transfer function of the transfer matrix 510 is $H_{DM}(\phi_1)=0$, $H_{DM}(\phi_2)=1$, $H_{CM}(\phi_1)=1$, $H_{CM}(\phi_2)=1$, this is primarily due to the switches M1–M4, which essentially pass the differential voltage of nodes 1 and 2 through to nodes 3 and 4 respectively, on $\phi_2$. However, the gain factor need not be exactly 1, but may be some other value. The important thing is that it be substantially 0 on $\phi_2$.

FIG. 7 represents another embodiment of the present invention. The elements of FIG. 7 correspond to the same-numbered elements of FIG. 6, however, the position of the transfer matrix 510 is before the three transistors Ma, Mb and Mc, rather than after. This results in lower noise operation, compared to the embodiment shown in FIG. 6. The embodiment shown in FIG. 6, however, generally allows for higher frequency operation, compared to the embodiment of FIG. 7.

Note that either PMOS or NMOS transistors may be used as switches in the present invention. Note further that given the use of the FET transistors as switches (rather than the amplifiers), the drain and the source function equivalently.

Figure 8:
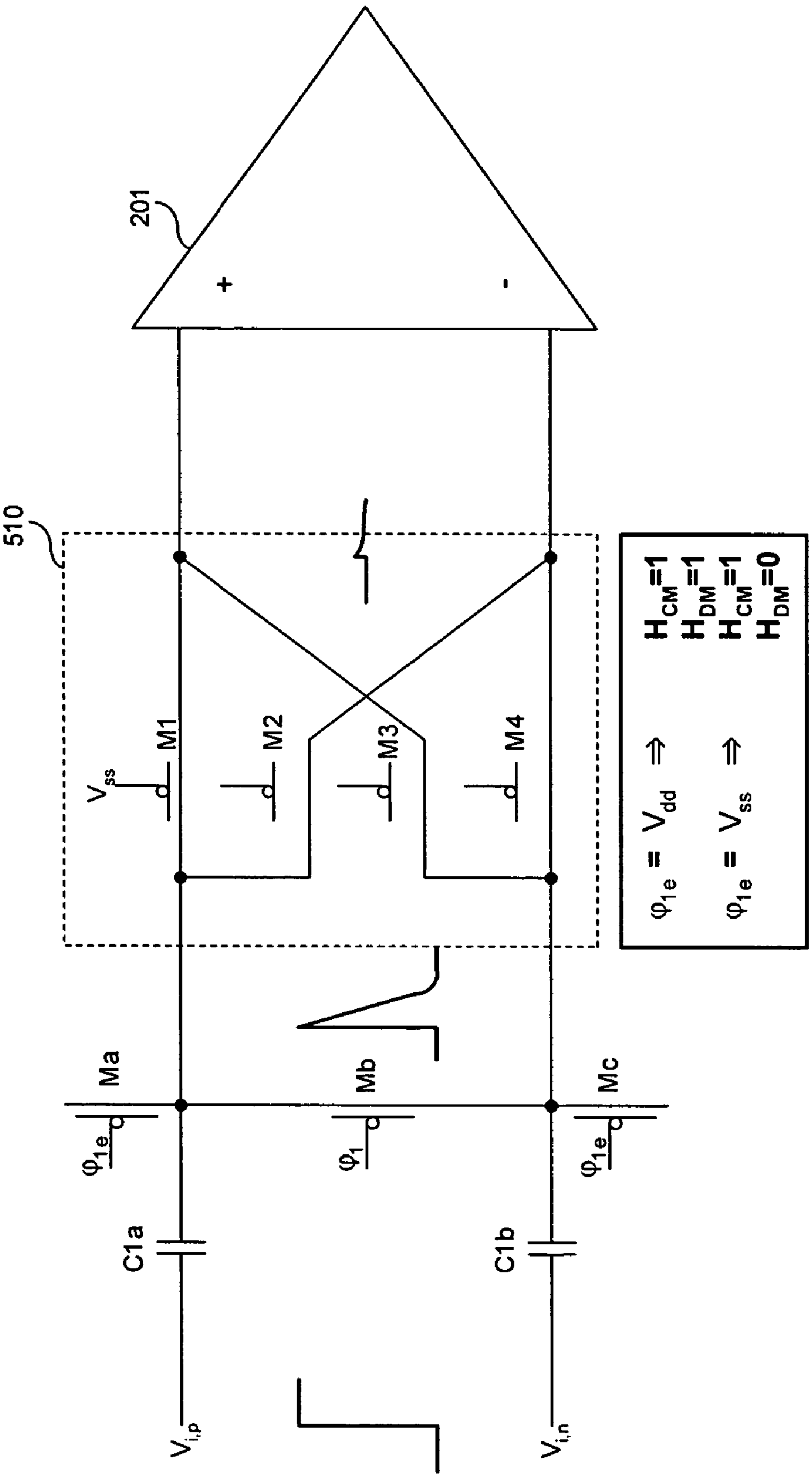
FIG. 8 illustrates a reduction in inter-symbol interference using the present invention.

FIG. 8 illustrates the improvement in the signal due to the transfer matrix 510. Note that the transistors Ma, Mb, Mc and the transistors of the transfer matrix M1–M4, are PMOS transistors, with the negative supply Vss used instead of the positive supply $V_{dd}$. As may be seen from FIG. 8, the amount of spike seen by the amplifier 201 after a step function outputted from the track-and-hold 101 is dramatically decreased due to the transfer function of the transfer matrix 510. $\phi_{1e}$ in FIG. 8 refers to an "early" phase $\phi_1$ of the two-phase clock. The small spike seen in FIG. 8 is due to a mis-match of the transistors M1–M4, and disappears entirely if the transistors are made bigger. In the event there is no spike (i.e., the transistors M1–M4 are perfectly matched), an approximately 50% improvement in speed is expected.

Note further that in the event of using a plurality of cascaded amplifier stages for a pipeline architecture (designated A, B, C, D), if the A and B stage switches are driven by the phase $\phi_1$, and the C and D stages are driven by $\phi_2$, the transfer matrix 510 is only needed for the A stage and the C stage. On the other hand, if the switches of the stages A, B, C and D are driven by alternating clock phases (i.e., $\phi_1$, $\phi_2$, $\phi_1$, $\phi_2$), each stage will need its own transfer matrix 510.

Although the above discussion is primarily in terms of analog to digital converters, and the application of the circuit 510 shown in FIG. 6 is directed to analog to digital converters, it will also be appreciated that the circuit 510 can be used as a multiplexer, in applications other than analog to digital converters. This is because the signal feedthrough in a circuit such as 510 is substantially less than in conventional multiplexers.

Figure 11:
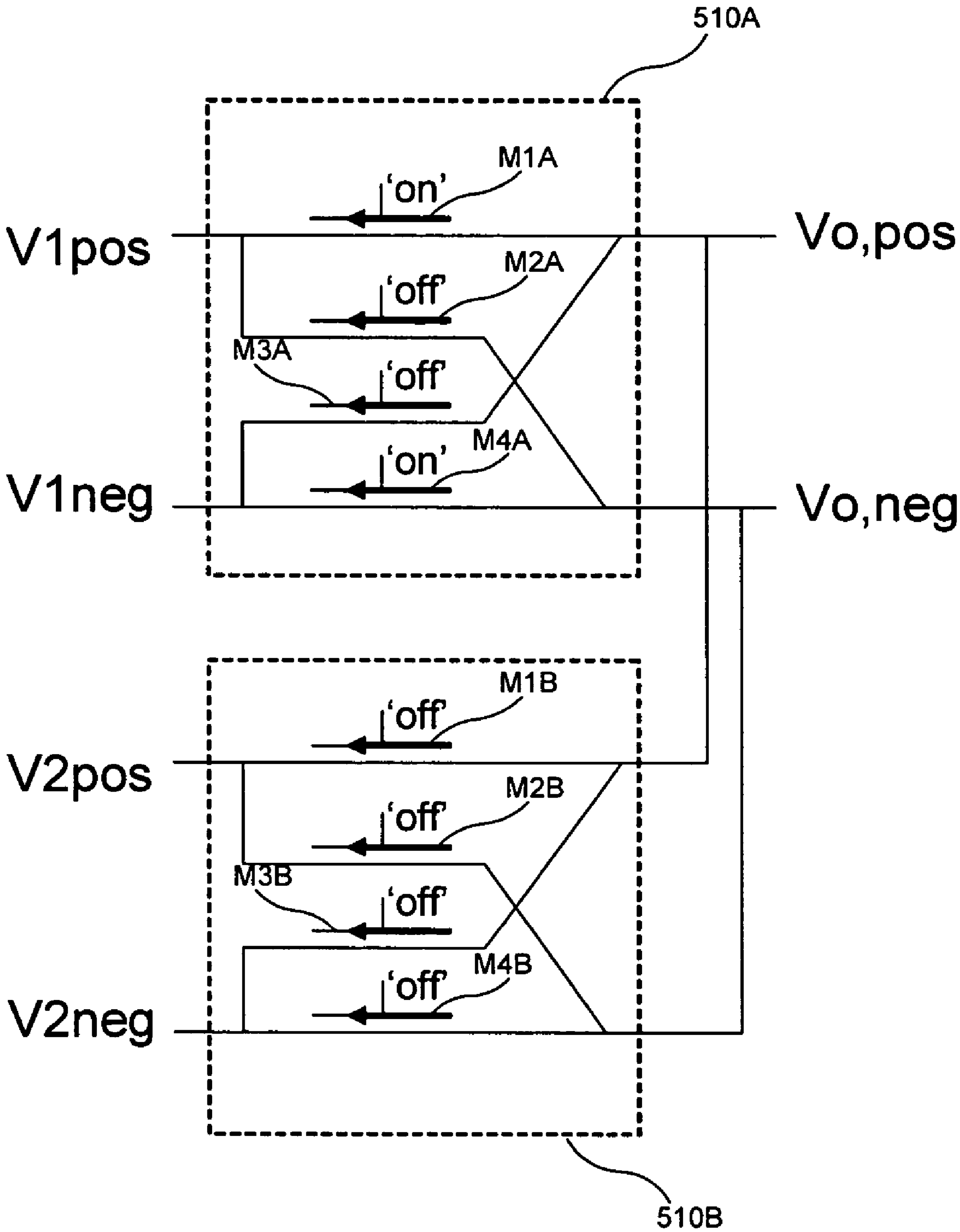
FIG. 11 illustrates how the circuit of FIG. 6 can be used as a differential multiplexer.

FIG. 11 illustrates how the circuit discussed previously, here labeled 510A and 510B, can be used as a differential multiplexer. As shown in FIG. 11, the differential multiplexer includes two circuits 510A, 510B, each of which is identical and includes four transistors, M1A, M2A, M3A, and M4A in circuit 510A, and corresponding transistors in the circuit 510B. The circuit 510A inputs the positive differential signal V1 ($V_{1,POS}$, $V_{1,NEG}$) and the circuit 510B inputs the differential signal V2 ($V_{2,POS}$, $V_{2,NEG}$). The output of the two circuits 510A, 510B is thus the differential output ($V_{O,POS}$, $V_{O,NEG}$). Thus, for each circuit 510, for each group of four transistors, the middle two transistors (e.g., M2A, M3A) are always off; their purpose is that feedthrough from V2pos now goes to both $V_{O,POS}$ and $V_{O,NEG}$. In other words, the middle switches, M2A, M3A, M2B, M3B are used for isolation. The purpose of the middle switches, M2A, M3A, M2B, M3B, is to provide effectively a "mirror parasitic capacitance" for the outer switches M1A, M4A, M1B, M4B, etc.

Therefore, the feedthrough, or leakage is common mode, and does not appear in the differential output voltage ($V_{O,POS}$, $V_{O,NEG}$). Thus, for the circuit 510A, both the common mode and the differential mode transfer function are one. For the circuit 510B, both transfers functions are zero.

Figure 9:
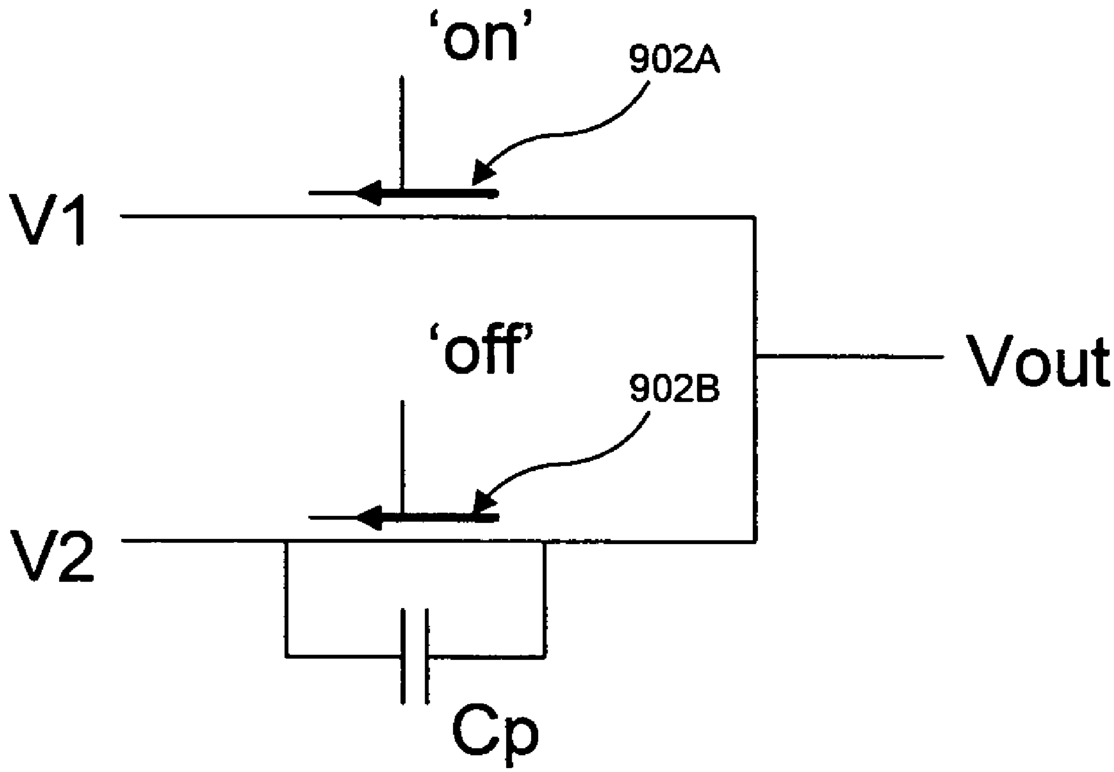
FIG. 9 illustrates a conventional multiplexer.

This circuit has the advantage that there is no need to have switches in series, therefore the on-resistance Ron is not higher than in the conventional circuit shown in FIG. 9. Also, if the switches are clocked, the gate capacitance is lower than in the conventional circuit of FIG. 10.

Figure 12:
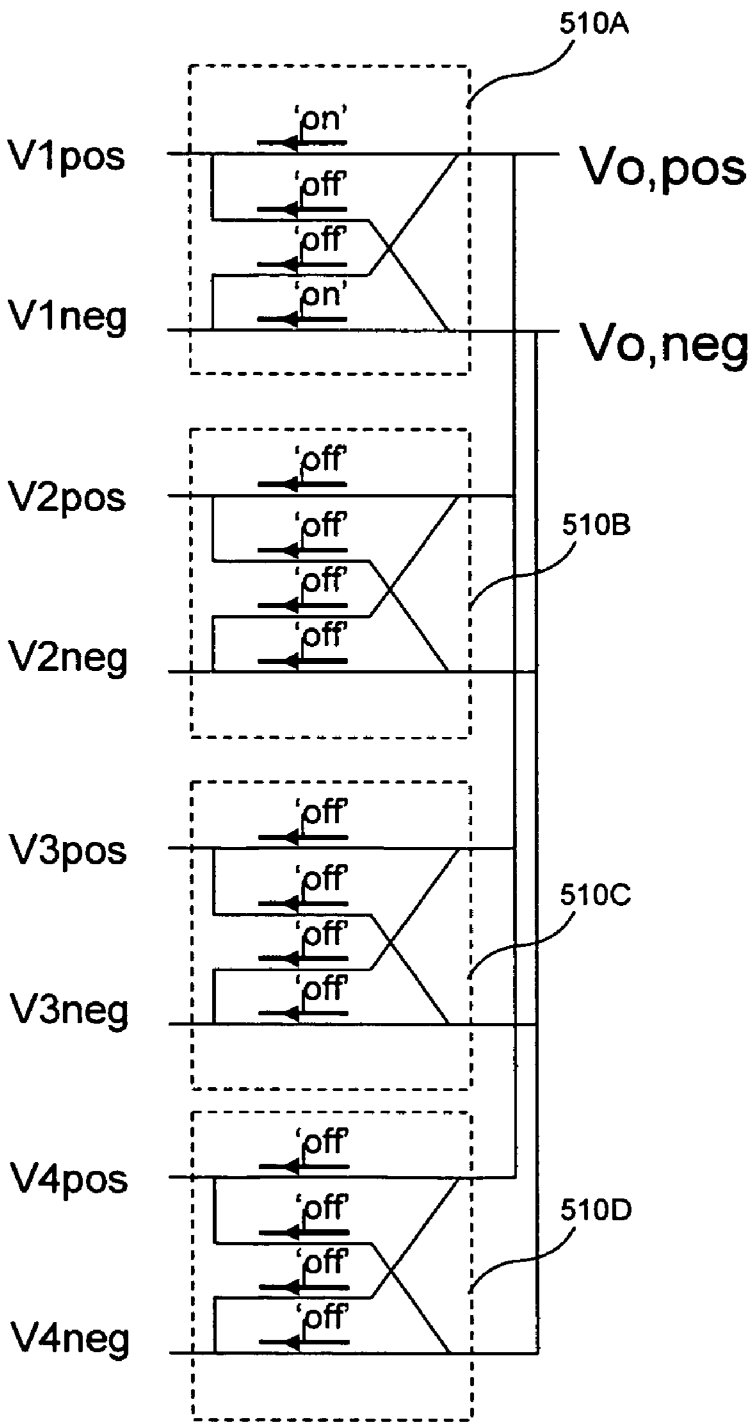
FIG. 12 illustrates how the circuit FIG. 11 can be adapted to a 4:1 multiplexer.

FIG. 12 illustrates how the multiplexer circuit 510 described above can be adapted to not just a 2:1 multiplexer, but to, for example, a 4:1 multiplexer. This figure illustrates how the multiplexing concept shown in FIG. 11 can be generalized to any N:1 multiplexer. Four multiplexing circuits 510A–510D are arranged as shown, with the differential inputs V1–V4 fed into the four circuits 510A–510D. A single differential output ($V_{O,POS}$, $V_{O,NEG}$) is generated, with minimal feedthrough from any of the non-selected inputs to the output.

CONCLUSION

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A differential multiplexer comprising:

a plurality of multiplexing circuits, each multiplexing circuit inputting a corresponding differential input signal including a positive input signal and a negative input signal, and outputting positive and negative output signals, and each multiplexing circuit comprising: first, second, third and fourth transistors, wherein the first and second transistors input the positive input signal, wherein the third and fourth transistors input the negative input signal, wherein outputs of the first and third transistors are connected to the positive output signal, wherein outputs of the second and fourth transistors are connected to the negative output signal; and wherein the positive output signals of the multiplexing circuits are coupled together at a first output node and the negative output signals are coupled together at a second output node.

2. The differential multiplexer of claim 1, wherein the positive and negative output signals are controlled using gate voltages on the first and fourth transistors.

3. The differential multiplexer of claim 1, wherein the second and third transistors are turned off when the differential multiplexer is in use.

4. A differential multiplexer comprising:

a plurality of multiplexing circuits;

each multiplexing circuit inputting a corresponding differential input signal including a positive input signal and a negative input signal, and outputting positive and negative output signals;

each multiplexing circuit comprising:

a plurality of transistors cross-coupled to make leakage between the positive and negative input signals common mode in the positive and negative output signals; and wherein the positive output signals of the multiplexing circuits are coupled together at a first output node and the negative output signals are coupled together at a second output node.

5. The differential multiplexer of claim 4, wherein each multiplexing circuit comprises:

first, second, third and fourth transistors, wherein the first and second transistors input the positive input signal, wherein the third and fourth transistors input the negative input signal, wherein outputs of the first and third transistors are connected to the positive output signal, wherein outputs of the second and fourth transistors are connected to the negative output signal.

6. The differential multiplexer of claim 5, wherein the positive and negative output signals are controlled using gate voltages on the first and fourth transistors.

7. The differential multiplexer of claim 5, wherein the second and third transistors are turned off when the differential multiplexer is in use.

* * * * *